United States Patent
Schreck

(10) Patent No.: US 6,806,707 B2
(45) Date of Patent: Oct. 19, 2004

(54) METHOD FOR THE PRESENTATION OF MAGNETIC RESONANCE IMAGE WITH A DESIGNATION OF DISTORTION-CONTAINING REGIONS

(75) Inventor: Oliver Schreck, Bamberg (DE)

(73) Assignee: Siemens Aktiengesellschaft, Münich (DE)

( * ) Notice: Subject to any disclaimer, the term of this patent is extended or adjusted under 35 U.S.C. 154(b) by 0 days.

(21) Appl. No.: 10/367,052

(22) Filed: Feb. 14, 2003

(65) Prior Publication Data

US 2003/0178996 A1 Sep. 25, 2003

(30) Foreign Application Priority Data

Feb. 14, 2002 (DE) .......................................... 102 06 192

(51) Int. Cl.⁷ ................................................. G01V 3/00
(52) U.S. Cl. ....................................... 324/307; 324/309
(58) Field of Search ................................... 324/307, 309, 324/311, 318, 322, 314; 335/299; 128/653

(56) References Cited

U.S. PATENT DOCUMENTS

| | | | | |
|---|---|---|---|---|
| 5,289,127 A | * | 2/1994 | Doddrell et al. | 324/314 |
| 5,757,187 A | * | 5/1998 | Wollin | 324/306 |
| 6,252,401 B1 | * | 6/2001 | Werthner et al. | 324/309 |

* cited by examiner

Primary Examiner—Brij B. Shrivastav
(74) Attorney, Agent, or Firm—Schiff Hardin LLP

(57) ABSTRACT

In a method for presenting a magnetic resonance image, at least one region of the magnetic resonance image containing distortions, such as due to inhomogeneities in a basic magnetic field and/or non-linearities in a gradient field employed to generate the magnetic resonance image, is made, and the magnetic resonance image is displayed with a designation of the region or regions containing the distortions.

11 Claims, 2 Drawing Sheets

METHOD FOR THE PRESENTATION OF MAGNETIC RESONANCE IMAGE WITH A DESIGNATION OF DISTORTION-CONTAINING REGIONS

BACKGROUND OF THE INVENTION

1. Field of the Invention

The present invention is directed to a method for the presentation of a magnetic resonance image.

2. Description of the Prior Art

Magnetic resonance technology is a known technique for, among other things, acquiring images of an inside of a body of an examination subject. In a magnetic resonance apparatus, rapidly switched gradient fields that are generated by a gradient system are superimposed on a static basic magnetic field that is generated by a basic field magnet. The magnetic resonance apparatus also has a radio-frequency system that radiates radio-frequency signals into the examination subject for triggering magnetic resonance signals and that picks up the generated magnetic resonance signal, on the basis of which magnetic resonance images are produced.

A good homogeneity of the basic magnetic field is a critical factor for the quality of the magnetic resonance images in magnetic resonance technology. Field inhomogeneities of the basic magnetic field within an imaging volume of the apparatus thereby cause geometrical distortions of the magnetic resonance image that are proportional to the field inhomogeneities. The same is true of non-linearities of the gradient fields.

A distortion-free and location-true imaging is important in many applications, for example in the employment of magnetic resonance images for planning radiotherapy of a tumor or for the preparation for or implementation of a surgical intervention.

Passive and active shim devices are known as measures for improving the basic magnetic field homogeneity. In the case of a passive shim device, a number of iron plates are attended in a suitable arrangement in the examination space of the magnetic resonance apparatus. The basic magnetic field within the imaging volume is measured before the attachment of the iron plates and a computer program determines the suitable number and arrangement of the iron plates therefrom. In an active shim device, shim coils are utilized that homogenize the basic magnetic field by suitable drive with direct currents are utilized. The shim coils usually are designed such that they essentially compensate a specific inhomogeneous field component corresponding to a coefficient of a spherical function representation of the basic magnetic field within the imaging volume.

Further, for example, German OS 198 29 850, corresponding to U.S. Pat. No. 6,252,401, discloses a method for the correction of distortions in magnetic resonance images as a consequence of inhomogeneities of the basic magnetic field and/or non-linearities of gradient fields. An image dataset belonging to the magnetic resonance image is suitably corrected with this method. However, limits are placed on the accuracy and non-ambiguity of the correction of distortions in direct dependence on the degree of the local inhomogeneity and/or non-linearity.

In some magnetic resonance apparatus, moreover, no further slices to be acquired can or should be planned on the basis of an image that has been distortion-corrected with the aforementioned method, since the slices fixed in the distortion-corrected image would not coincide with the actual conditions in the examination subject.

SUMMARY OF THE INVENTION

An object of the invention is to provide an improved method for the presentation of a magnetic resonance image with which, among other things, distortions contained in the magnetic resonance image can be taken into consideration in a simple way in further image-dependent planning.

The above object is achieved in accordance with the principles of the present invention in a method for displaying a magnetic resonance image wherein an identification is made, prior to the display of the magnetic resonance image for diagnostic purposes, of any regions of the image which contain distortions, and the magnetic resonance image is displayed with that region or those regions containing distortions being designated.

In accordance with the inventive method, a viewer, for example a diagnosing physician, can determine how greatly the displayed anatomy differs from "real" anatomy from the suitably designated magnetic resonance image at first glance and can appropriately take this into consideration in, for example planning a therapy or operation. Further, the viewer can plan further slices to be imaged in the designated magnetic resonance image and can appropriately take the distortions into consideration at the same time based on the enhanced informational content of the designated: magnetic resonance image.

In an embodiment, a distortion correction matrix wherein the distortions are encoded is superimposed on the magnetic resonance image for the designation. The distortion correction matrix indicates at what locations and how significantly the magnetic resonance image, or a region to be imaged must be corrected as a consequence of the inhomogeneities of the basic magnetic field and non-linearities of gradient fields that prevail in the region to be imaged during the image exposure. The distortion correction matrix is derived, for example, from a distortion correction method with which the magnetic resonance image is distortion-corrected. On the basis of the distortion correction matrix, a degree of the distortion is encoded, for example, chromatically and/or in terms of intensity, for example with a color scale from white to red. In combination with the distortion correction method employed, further, the distortion correction matrix can contain information about the extent of remaining residual distortions in the distortion-corrected magnetic resonance image as a result of inaccuracies and ambiguities of the distortion correction method. In one embodiment of the method, only the aforementioned residual distortions are chromatically encoded and/or encoded in terms of intensity. Locations of the magnetic resonance image for which an unambiguous distortion correction can be implemented are not designated.

DESCRIPTION OF THE PREFERRED EMBODIMENTS

Figure 1:
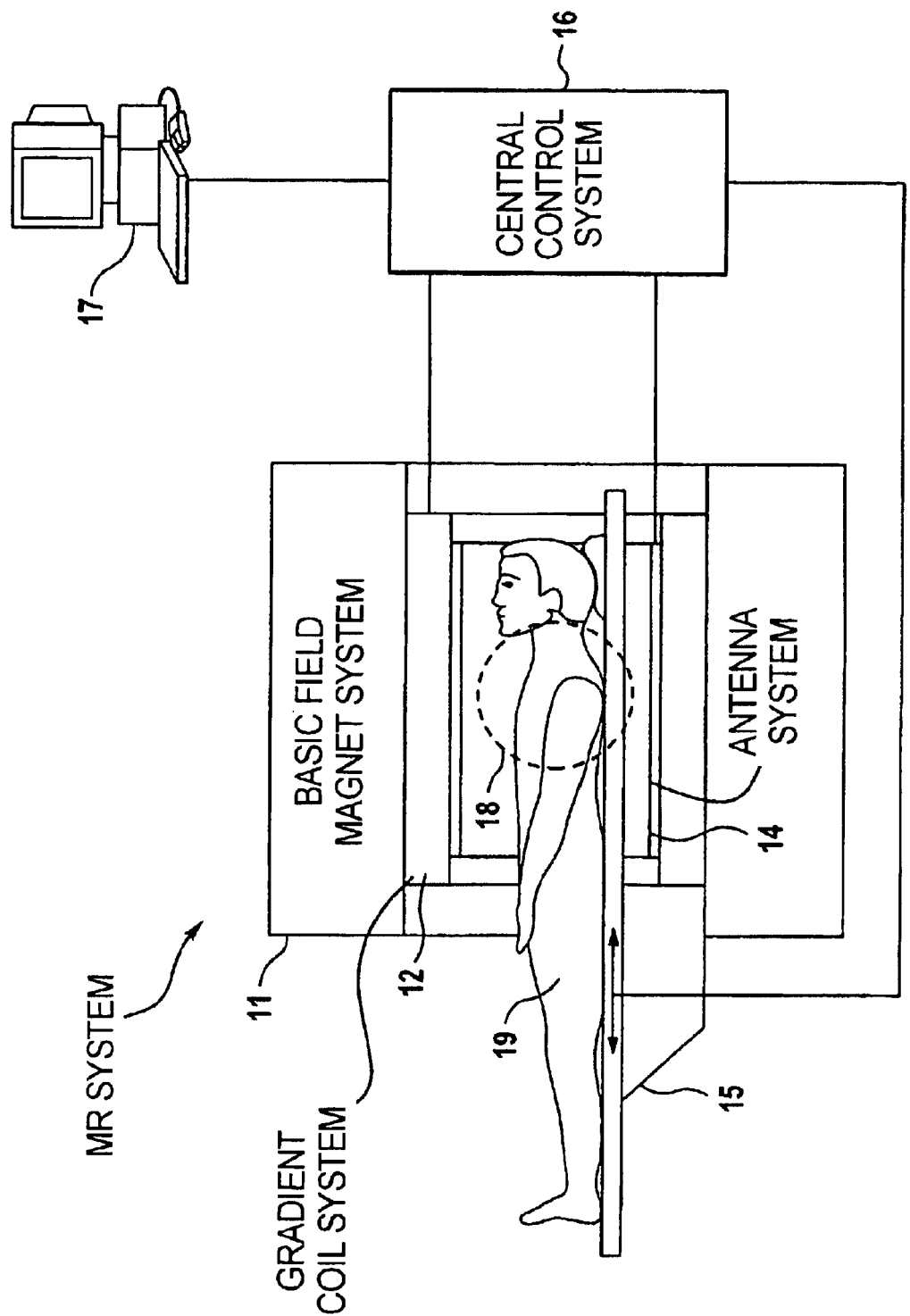
FIG. 1 is a schematic illustration of a magnetic resonance apparatus operable in accordance with the inventive method.

FIG. 1 shows the basic compounds of a magnetic resonance apparatus. The magnetic resonance apparatus has a basic field magnet system 11 for generating a basic magnetic field and a gradient coil system 12 for generating gradient fields. The magnetic resonance apparatus also has an antenna system 14 that emits radio-frequency signals into an examination subject for triggering magnetic resonance signals and picks up the magnetic resonance signals that are generated. Further, the magnetic resonance apparatus has a displaceable support mechanism 15 on which the examination subject, for example a patient 19 to be examined, is borne.

The gradient coil system 12 is connected to a central control system 16 for controlling currents in the gradient coil system 12 on the basis of an operating sequence. For controlling the radio-frequency signals to be emitted according to the sequence as well as for the further-processing and storage of the magnetic resonance signals picked up by the antenna system 14, the antenna system 14 is likewise connected to the central control system 16. The support mechanism 15 is also connected to the central control system 16 for controlling displacement of the support mechanism 15, for example in order to position a region at shoulder height of the patient 19 in an imaging volume 18 of the apparatus, as the region to be imaged. The central control system 16 is connected to a display and operating console 17 via which the inputs of an operator, for example the desired sequence type and sequence parameters, are supplied to the central control system 16. Among other things, further, the generated magnetic resonance images are displayed at the display and operating console 17.

Figure 2:
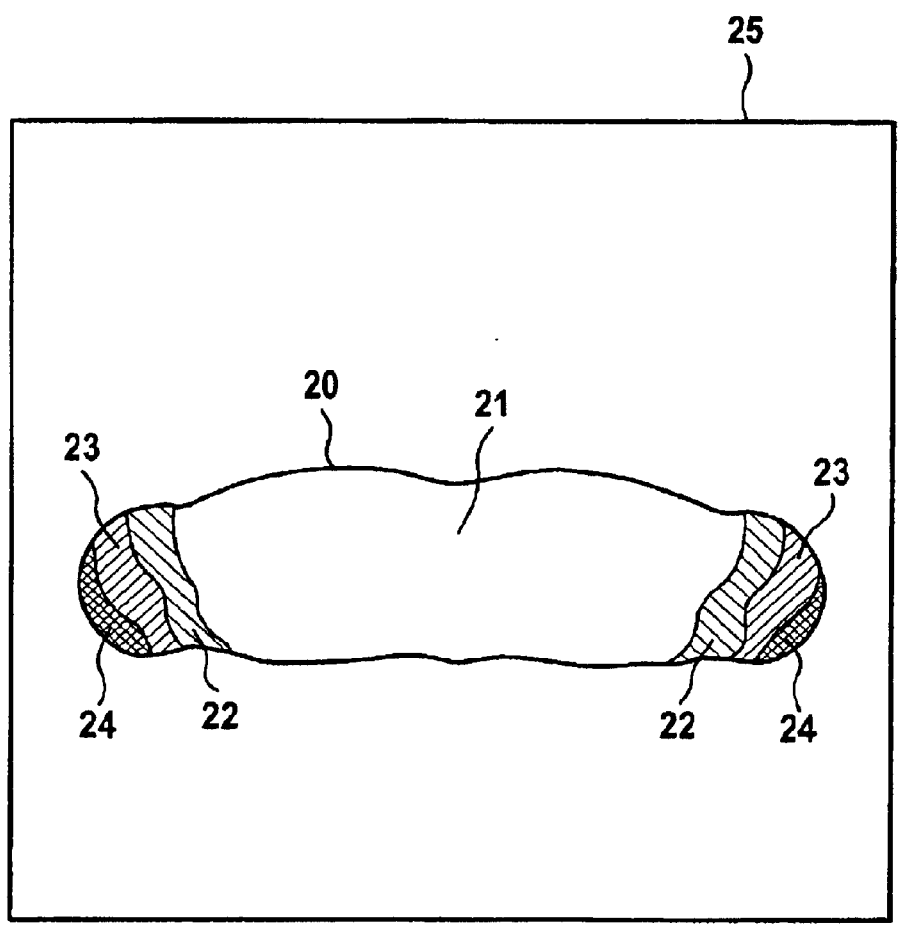
FIG. 2 illustrates a magnetic resonance image, designated in accordance with the inventive method.

As an exemplary embodiment of the invention, FIG. 2 shows a designated (marked., in this case) magnetic resonance image 25. A distortion correction matrix wherein a degree of distortions is encoded in terms of intensity is superimposed on a magnetic resonance image. The magnetic resonance image, for example, is registered with the magnetic resonance apparatus as shown in FIG. 1 and indicates a distortion-corrected transverse section 20 through the shoulder and chest region of the patient 19. Before any display for diagnostic purposes, the data registered from the shoulder and chest region are distortion-corrected in the central control system 16, for example with a method according to the initially cited German OS 198 29 850. In the inventive method a distortion correction matrix is employed for the distortion correction that indicates at which locations and what extent the shoulder and chest region must be corrected as a consequence of the inhomogeneities of the basic magnetic field and non-linearities of the gradient fields prevailing in the image exposure.

The appropriately distortion-corrected transverse section 20 is displayed at the display and operating console 17. The distortion correction matrix is superimposed on the overall section 20 in an manner edited such that the matrix is not overlaid (i.e. no hatching) in a first region 21 of the section 20 wherein no distortions occur, and such that a hatching having a first intensity is overlaid on the section 20 in a second region 22 wherein slight distortions occur, and such that the section 20 is overlaid with a hatching having a second intensity that is stronger than the first in a third region 23 wherein moderate distortions occur, and such that the section 20 is overlaid with a hatching having a third intensity that is stronger than the second in a fourth region 24 wherein more serious distortions occur.

In another embodiment, instead of hatching, a coloring is employed with which the second through fourth region 22 through 24 are displayed respectively with different colors or different color gradations.

On the basis of the designated magnetic resonance image. 25, it is possible for a viewer, for example a diagnosing physician, to take the indicated deviations between displayed and real anatomy into consideration when planning a therapy or surgery for the patient 19. In, for example, a radiothermia treatment, the region to be irradiated must be able to be delimited as exactly as possible relative to healthy tissue in order to keep the stress on the healthy tissue as low as possible. When the radiothermia planning is undertaken on the basis of the designated magnetic resonance image 25 wherein the distortions are characterized according to their intensity, irradiated regions with distortions are treated more carefully, for example with monitoring exposures being made more frequently during the radiothermia treatment or treatment is carried out with a lower radio-frequency dose. A reduced stress on healthy tissue is thereby achieved.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for presentation of a magnetic resonance image, obtained using a non-ideal magnetic field comprising the steps of:
   automatically electronically identifying at least one region of a magnetic resonance image containing a distortion due to said non-ideal magnetic field; and
   presenting said magnetic resonance image in a display at a display device and, in said display, automatically electronically visually designating said at least one region.

2. A method as claimed in claim 1 comprising designating said at least one region with a color.

3. A method as claimed in claim 1 comprising designating said at least one region with a pattern.

4. A method as claimed in claim 1 comprising designating said at least one region by generating a distortion correction matrix wherein distortions in said image are encoded, and superimposing said distortion correction matrix on said magnetic resonance image to designate said at least one region.

5. A method as claimed in claim 4 comprising generating said distortion correction matrix using a distortion correction algorithm.

6. A method as claimed in claim 5 comprising the additional step of distortion correcting said magnetic resonance image using said distortion correction algorithm.

7. A method as claimed in claim 1 comprising designating a degree of said distortion in said at least one region chromatically.

8. A method as claimed in claim 1 comprising designating a degree of said distortion in said at least one region by a displayed intensity of said at least one region.

9. A method as claimed in claim 1 wherein the step of identifying said at least one region containing said distortion comprises identifying at least one region in said magnetic resonance image containing a distortion due to inhomogeneities of a basic magnetic field employed in acquiring said magnetic resonance image.

10. A method as claimed in claim 1 wherein the step of identifying said at least one region containing said distortion comprises identifying at least one region in said magnetic resonance image containing a distortion due to non-linearities of a gradient field employed in acquiring said magnetic resonance image.

11. A method as claimed in claim 1 wherein the step of identifying said at least one region containing said distortion comprises identifying at least one region in said magnetic resonance image containing a distortion due to inhomogeneities of a basic magnetic field and non-linearities of a gradient field employed in acquiring said magnetic resonance image.

* * * * *